United States Patent [19]

Parmentier

[11] Patent Number: 4,483,067
[45] Date of Patent: Nov. 20, 1984

[54] METHOD OF MANUFACTURING AN IDENTIFICATION CARD AND AN IDENTIFICATION MANUFACTURED, FOR EXAMPLE, BY THIS METHOD

[75] Inventor: Paul Parmentier, Cailly-sur-Eure, France

[73] Assignee: U.S. Philips Corporation, New York, N.Y.

[21] Appl. No.: 416,791

[22] Filed: Sep. 10, 1982

[30] Foreign Application Priority Data

Sep. 11, 1981 [FR] France .............................. 81 172321

[51] Int. Cl.³ .............................................. H05K 3/34
[52] U.S. Cl. ....................................... 29/890; 29/588; 174/52 PE; 361/386; 235/492
[58] Field of Search ................. 29/825, 827, 830, 832, 29/836, 841, 840, 588; 361/386; 174/52 PE; 235/492

[56] References Cited

U.S. PATENT DOCUMENTS 3,885,304  5/1975  Kaiser et al. .
3,934,336  1/1976  Morse .
4,004,133  1/1977  Hannan et al. .
4,216,577  8/1980  Badet et al. .
4,264,917  4/1981  Ugon .
4,396,936  8/1983  McIver et al. .

FOREIGN PATENT DOCUMENTS 2177106  11/1973  France .
2047474  11/1980  United Kingdom .

Primary Examiner—Howard N. Goldberg
Assistant Examiner—Carl J. Arbes
Attorney, Agent, or Firm—Jack E. Haken; James J. Cannon, Jr.

[57] ABSTRACT

An identification card with an integrated semiconductor circuit (13) which is mounted on a secondary carrier (11) and which is electrically connected to conductor patterns (3, 5) on both sides of the secondary carrier (11). The secondary carrier (11) is mounted in a primary carrier (29) together with the integrated semiconductor circuit (13). The secondary carrier (11) comprises a plated-through hole (7) which is partly removed in order to form a recess (15) in the secondary carrier (11) in which the semiconductor circuit (13) is accommodated. The semiconductor circuit (13) is electrically connected, by means of connection wires (23, 25), to a conductor pattern (3) on the secondary carrier (11) and, also using an electrically conductive glue (21) and the metal hole plating (18) of the remainder (17) of the plate-through hole (7), to the other conductor pattern (5) on the secondary carrier (11).

1 Claim, 4 Drawing Figures

METHOD OF MANUFACTURING AN IDENTIFICATION CARD AND AN IDENTIFICATION MANUFACTURED, FOR EXAMPLE, BY THIS METHOD

BACKGROUND OF THE INVENTION

1. Field of the Invention

The invention relates to a method of manufacturing an identification card in which an integrated semiconductor circuit is brought into electrical contact on both sides with conductor patterns on at least one side of a secondary carrier which is subsequently mounted, together with the integrated circuit, in a primary carrier, the integrated circuit being enclosed by a quantity of electrically insulating material which fills a recess in one of said carriers.

2. Description of the Prior Art

The invention also relates to an identification card comprising an integrated semiconductor which is electrically connected on both sides to conductor patterns on at least one side of a secondary carrier which is mounted in a primary carrier, together with the integrated circuit, as one unit, the integrated circuit being enclosed by an electrically insulating material which fills a recess in one of said carriers.

In a known method and identification card (French Patent Specification No. 2,439,438) of the kind set forth the integrated circuit which is mounted on the secondary carrier is arranged in a recess in the primary carrier. A comparatively deep recess in the primary carrier has the drawback that in practice substantial mechanical loading of the primary carrier occurs due to the frequent bending. Therefore, the aim is to keep the depth of the recess in the primary carrier as small as possible with respect to the overall thickness of the primary carrier and also to keep the overall thickness within a standardized maximum value. Moreover, in order to enhance the reliability and to obtain a comparatively inexpensive card, the aim is also to utilize widely used techniques and standard components as much as possible.

It is the object of the invention to provide a method of manufacturing an identification card, and also an identification card, in which said drawback is avoided and whereby the described requirements are met as well as possible.

SUMMARY OF THE INVENTION

To this end, the method of manufacturing an identification card in accordance with the invention is characterized in that the secondary carrier which comprises a conductor pattern on both sides is provided with at least one plated-through hole, the recess subsequently being provided at the area of said hole in the secondary carrier, said recess opening into the part of the plated-through hole which remains after the formation of the recess, the integrated circuit subsequently being arranged in the recess and being connected on one side, by means of an electrically conductive bonding medium and the metal hole plating, to the conductor pattern on one side of the secondary carrier, its other side subsequently being connected to the conductor pattern on the other side of the secondary carrier.

To this end, an identification card in accordance with the invention is characterized in that the secondary carrier which is provided with a conductor pattern on both sides comprises at least one plated-through hole in which a recess in the secondary carrier opens, the integrated circuit being arranged in the recess and being electrically connected on one side to the conductor pattern on one side of the secondary carrier and on the other side, by means of an electrically conductive bonding medium and the metal hole plating, to the conductor pattern on the other side of the secondary carrier.

It is to be noted that U.S. Pat. No. 3,934,336 describes a method of electrically connecting both sides of an integrated circuit to a conductor pattern provided on a substrate. The integrated circuit is arranged in a recess in the substrate.

BRIEF DESCRIPTION OF THE DRAWINGS

The invention will be described in detail hereinafter with reference to the drawing. Therein.

DESCRIPTION OF THE PREFERRED EMBODIMENT

Figure 1A:
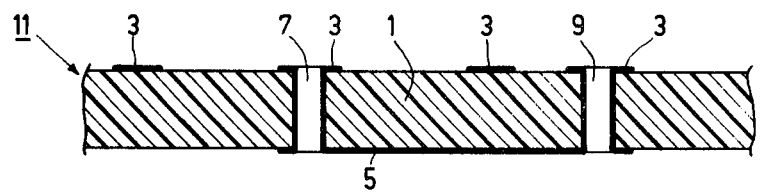
FIG. 1A is a sectional view of a secondary carrier used in an identification card in accordance with the invention.

The electrically insulating substrate 1 which is shown in FIG. 1A is provided on one side with a conductor pattern 3 and on its other side with a conductor pattern 5. The electrical connections between the conductor patterns 3 and 5 are formed by a number of plated-through holes 7 and 9. The substrate 1 with its conductor patterns 3 and 5 forms the so-called secondary carrier 11 for an integrated semiconductor circuit 13 (see FIG. 1C). A customary carrier with printed circuitry and plated-through holes is preferably used as the secondary carrier 11, for example, a substrate of hard paper or glass fiber reinforced epoxy with conductor patterns manufactured by subtractive and/or additive techniques.

Figure 1B:
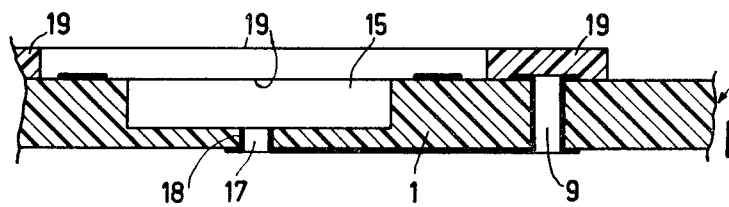
FIG. 1B is a sectional view of the secondary carrier of FIG. 1A comprising a recess for an integrated circuit and also a frame.
Figure 1C:
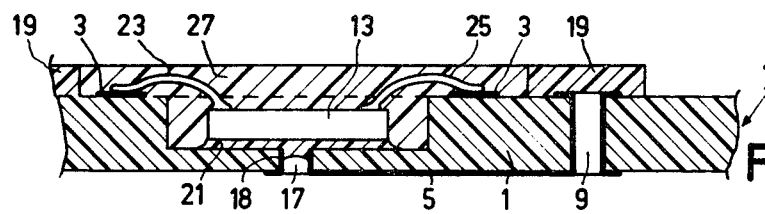
FIG. 1C is a sectional view of the secondary carrier of FIG. 1B, an integrated circuit enclosed by an electrically insulating material being mounted in the recess of the secondary carrier.

At the area of the plated-through hole 7 the secondary carrier comprises a recess 15 which is so large that the integrated circuit 13 can be accommodated (see FIGS. 1B and 1C). The depth of the recess 15 is such that a part 17 of the plated-through hole 7 remains. This is of essential importance for an identification card in accordance with the invention. On the upper side of the substrate 1 there is subsequently provided a closed, flat frame 19 (not visible in FIG. 1A) for reasons yet to be described. The frame 19 is preferably formed by the application of a photosensitive layer which is cured by local exposure, the unexposed part thereof being removed by etching. For this purpose use can be made of the same type of photosensitive material as used for the formation of the conductor patterns 3 and 5.

After the formation of the recess 15, the integrated circuit 13 is secured to the bottom of the recess 15 by means of an electrically conductive glue or paste 21 (see FIG. 1C). The quantity of glue 21 is chosen so that the glue partly fills the remaining part 17 of the plated-through hole 7. The electrical contact with the conductor pattern 5, consequently, is established via the metal plating 18 of the remaining part 17 of the plated-through hole 7. The integrated circuit 13 is of a type which comprises electrical connections (electrodes) on both sides. The so-called active connections are situated on the upper side of the integrated circuit in the present case, while the so-called ground connection is situated on its lower side.

After the ground connection has been established by means of the glue 21, connection wires 23 and 25 are electrically connected on the upper side of the integrated circuit 13 to the relevant electrodes of the circuit and to the conductor pattern 3 on the upper side of the substrate 1 in a customary manner. The space enclosed by the frame 19 is filled with a resin 27 of an electrically insulating material. After the curing of the resin 27, the integrated circuit 13 as well as the connection wires 23 and 25 are firmly anchored to the substrate 1. The thickness of the frame 19 is chosen so that the connection wires 23 and 25 are fully covered by the resin 27. The frame 19 determines not only the thickness of the resin layer but also prevents the flowing of the resin 27 into the plated-through hole 9 which is situated near the recess 15.

Figure 2:
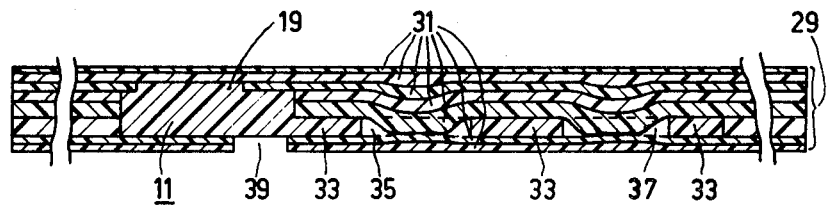
FIG. 2 shows an identification card in accordance with invention.

The secondary carrier 11 is subsequently arranged, together with the integrated circuit 13 anchored therein, in a primary carrier 29 which is formed by a number of strips 31 of an electrically insulating, thermoplastic material. The integrated circuit is situated between a number of strips 31 of thermoplastic material which are compressed in order to form a lamination. The secondary carrier 11 comprises a projecting portion 33 of smaller thickness in which there are provided openings 35 and 37. The portion 33 can be formed in the secondary carrier simultaneously with the recess 15 on a suitable machine. During the hot compression of the strips 31 in order to form a primary carrier 29, the strips are laminated. Moreover, strip material flows into the openings 25 and 37 from both sides, so that the strip material is anchored through the openings 35 and 37. The secondary carrier 11 is thus anchored in the primary carrier 29. The lower two strips 31 of FIG. 2 comprise an opening 39 wherethrough electrical contact can be established with the integrated circuit.

The strips 31 are made of polyvinylchloride in the present case. Use is made of eight strips having the following thicknesses (proceeding from the top downwards): 100, 100, 100, 100, 200, 200, 100 and 60 micrometers. The thickness of 960 micrometers of the primary carrier 29 is reduced to 760 micrometers by hot compression, so that it satisfies the thickness standard for identification cards.

The described manufacturing steps are customarily performed in the bulk manufacture of electronic components and have resulted in a high reliability and a comparatively low cost price. The components used also satisfy these requirements. For the manufacture of the substrates 1 and the strips 31 use is preferably made of comparatively large material surfaces, so that a large number of substrates 1 and strips 11 can be simultaneously obtained in a single operation. This results in a high reproducibility and a low rejection percentage. The frame 19 can also be simultaneously manufactured in this manner for a large number of identification cards.

Depending on the application of the electronic identification card, one or more integrated circuits can be mounted in the secondary carrier 11. These circuits may be memory circuits or processor circuits and also combinations of such circuits. For example, depending on the data stored in the memory circuit, the card may be used exclusively for the identification of persons or objects, but in combination with identification it can also be used in a more active manner, for example, as a credit card which can be electronically written in and read. Identification of objects may concern, for example, quality testing of products during the manufacturing process.

What is claimed is:

1. A method of manufacturing an identification card in which an integrated semiconductor circuit is brought into electrical contact on both sides with conductor patterns on at least one side of a secondary carrier which is subsequently mounted, together with the integrated circuit, in a primary carrier, the integrated circuit being enclosed by a quantity of electrically insulating material which fills a recess in one of said carriers, comprising the steps of:

providing the secondary carrier (11) which comprises a conductor pattern (3, 5) on both sides with at least one plated-through hole (7);

providing a recess (15) subsequently at the area of said hole (7) in the secondary carrier (11);

said recess (15) opening into the part (17) of the plated-through hole (7) which remains after the formation of the recess (15);

arranging the integrated circuit (13) subsequently in the recess (15) and connecting it on one side, by means of an electrically conductive bonding medium (21) and the metal hole plating (18), to the conductor pattern (5) on one side of the secondary carrier (11), and connecting its other sidesubsequently to the conductor pattern (3) on the other side of the secondary carrier (11).

* * * * *